United States Patent
Ueta et al.

(10) Patent No.: US 8,698,168 B2
(45) Date of Patent: Apr. 15, 2014

(54) SEMICONDUCTOR DEVICE HAVING ALUMINUM NITRIDE LAYER WITH VOID FORMED THEREIN

(75) Inventors: Yoshihiro Ueta, Osaka (JP); Masataka Ohta, Osaka (JP); Yoshinobu Aoyagi, Kusatsu (JP); Misaichi Takeuchi, Kusatsu (JP)

(73) Assignees: Sharp Kabushiki Kaisha, Osaka-shi, Osaka (JP); The Ritsumeikan Trust, Kyoto-shi, Kyoto (JP)

( * ) Notice: Subject to any disclaimer, the term of this patent is extended or adjusted under 35 U.S.C. 154(b) by 221 days.

(21) Appl. No.: 13/039,978

(22) Filed: Mar. 3, 2011

(65) Prior Publication Data
US 2012/0007039 A1    Jan. 12, 2012

(30) Foreign Application Priority Data

Jul. 8, 2010 (JP) .................. 2010-155388
Feb. 28, 2011 (JP) .................. 2011-042479

(51) Int. Cl.
*H01L 27/15* (2006.01)

(52) U.S. Cl.
USPC .................. 257/81; 257/103

(58) Field of Classification Search
USPC .......... 257/13, 14, 31, 95, 103, E29.069, 81
See application file for complete search history.

(56) References Cited

U.S. PATENT DOCUMENTS

| 5,218,216 A | 6/1993 | Manabe et al. |
| 2006/0046511 A1 | 3/2006 | Shibata et al. |
| 2007/0034883 A1* | 2/2007 | Ohba .................. 257/85 |
| 2010/0275836 A1 | 11/2010 | Sato et al. |
| 2011/0101307 A1* | 5/2011 | Lee et al. .................. 257/22 |
| 2012/0258286 A1* | 10/2012 | Amano et al. .................. 428/162 |

FOREIGN PATENT DOCUMENTS

| JP | 63-188938 | 8/1988 |
| JP | 2000-277435 | 10/2000 |
| JP | 2004-35275 | 2/2004 |
| JP | 2009-155141 | 7/2009 |
| JP | 2009-167053 | 7/2009 |
| WO | WO2011/077541 A1 * | 6/2011 |

OTHER PUBLICATIONS

Nam, O-H., et al. (1997). "Lateral epitaxy of low defect density GaN layers via organometallic vapor phase epitaxy," *Appl. Phys. Lett.* 71(18):2638-2640.

Kuramoto, M., et al. (1999). "Room-Temperature Continuous-Wave Operation of InGaN Multi-Quantum-Well Laser Diodes Grown on a n-GaN Substrate with a Backside n-Contact," *Jpn. J. Appl. Phys.* 38(2B):L184-L186.

Zheleva, T. S., et al. (1999). "Pendeo-Epitaxy: A New Approach for Lateral Growth of Gallium Nitride Films," *Journal of Electronic Materials* 28(4):L5-L8.

* cited by examiner

*Primary Examiner* — Hung Vu
(74) *Attorney, Agent, or Firm* — Morrison & Foerster LLP

(57) ABSTRACT

A method of crystal growth is provided which can suppress development of dislocations and cracks and a warp in a substrate. The method of crystal growth of a group III nitride semiconductor has: a step of heating a silicon substrate; and a step of forming a depressed structure on the substrate surface by advance-feeding onto the heated silicon substrate a gas containing at least TMA (trimethylaluminum).

6 Claims, 9 Drawing Sheets

PRACTICAL EXAMPLE (SAMPLE B)

AlN (BUFFER LAYER SURFACE)

AlGaN (SAMPLE'S TOPMOST SURFACE)

FIG.9A PRACTICAL EXAMPLE (SAMPLE B)
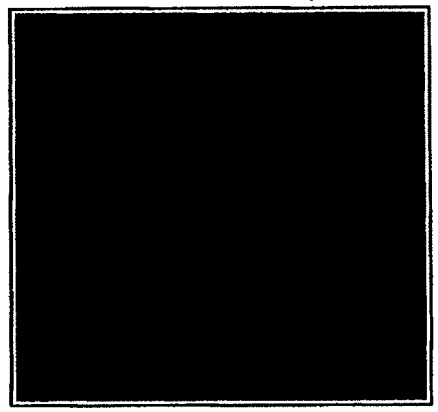
FIG.9B COMPARATIVE EXAMPLE 1 (SAMPLE C)
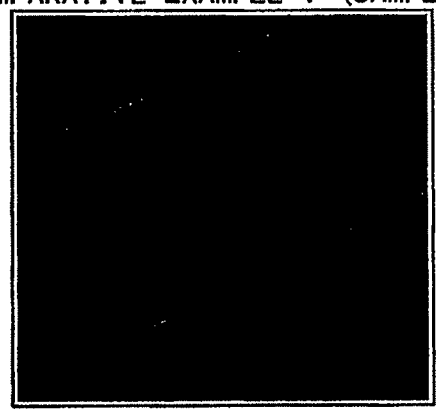
FIG.9C COMPARATIVE EXAMPLE 2 (SAMPLE D)
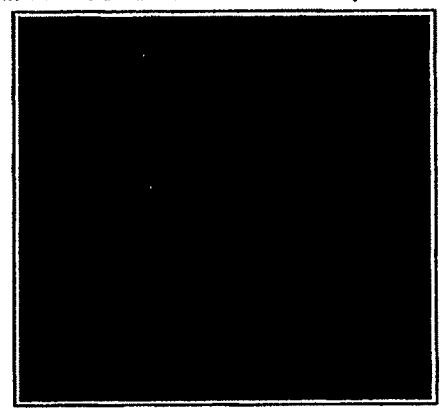

SEMICONDUCTOR DEVICE HAVING ALUMINUM NITRIDE LAYER WITH VOID FORMED THEREIN

This nonprovisional application claims priority under 35 U.S.C. §119(a) on Patent Application No. 2010-155388 filed in Japan on Jul. 8, 2010 and Patent Application No. 2011-042479 filed in Japan on Feb. 28, 2011, the entire contents of both of which are hereby incorporated by reference.

BACKGROUND OF THE INVENTION

1. Field of the Invention

The present invention relates to a crystal growth method and a semiconductor device, and more particularly to a crystal growth method for a nitride-based compound semiconductor and a semiconductor device formed thereby.

2. Description of Related Art

GaN-based compound semiconductors such as GaN, InGaN, and AlGaN are receiving attention as materials for blue light-emitting diodes (LEDs) and laser diodes (LDs). For their good thermal and environmental resistance, GaN-based compound semiconductors are today applied in and developed for electronic devices as well.

On the other hand, with GaN-based compound semiconductors, bulk crystal growth is difficult, and this makes practically usable GaN substrates extremely expensive. For this reason, most substrates for growth of nitride semiconductors currently in wide practical use are those of sapphire, and the commonly used method is to grow GaN epitaxially on top of a single crystalline sapphire substrate by a metal organic vapor phase epitaxy (MOVPE) method or the like.

Here, a sapphire substrate has a different lattice constant from GaN, and therefore according to a conventionally proposed method, first, a buffer layer of AlN or GaN (low-temperature-grown buffer layer) is grown on top of a sapphire substrate at low temperature so as to alleviate lattice distortion in this low-temperature-grown buffer layer, and thereafter a GaN layer is grown on top. This method is disclosed, for example, in JP-A-S63-188938. The introduction of this low-temperature-grown buffer layer made single crystalline epitaxial growth of GaN possible, and led to the practical use of light-emitting diodes (LEDs) covering an ultraviolet to green region.

Inconveniently, however, even that method is ineffective in coping with lattice mismatch between substrate and crystal, with the result that the grown GaN has numberless defects. These defects will probably prove a hindrance in the fabrication of GaN-based LDs (laser diodes).

On the other hand, recent years have seen reports of, as methods that help reduce the density of defects ascribable to the difference in lattice constant between sapphire and GaN, crystal growth technologies such as ELO (epitaxial lateral overgrowth), FIELO (facet-initiated epitaxial lateral overgrowth), and pendeo-epitaxy, and these technologies now yield GaN epitaxial wafers with excellent high crystallinity. Methods such as ELO and FIELO produce single crystalline GaN layers with low defect density, and permit an LED structure to be formed on top of such a GaN layer or on top of a GaN layer of a sapphire substrate using a low-temperature-grown buffer layer. A crystal growth technology using ELO is disclosed, for example, in Appl. 71 (18) 2638 (1997), and a crystal growth technology using FIELO is disclosed, for example, in Japan. J. Appl. Phys. 38, L184 (1999). A crystal growth technology using pendeo-epitaxy is disclosed, for example, in MRS Internet J. Nitride Semicond. Res. 4S1, G3.38 (1999).

Furthermore, with the aim of reducing defect density and obtaining high-quality epitaxial layers, according to another conventionally proposed method, an anti-surfactant region (residual Si portion) is formed on a substrate, and a GaN-based semiconductor is grown while a void is formed over that region. This growth method is disclosed, for example, in JP-A-2000-277435.

On the other hand, recent years have seen high expectations for ultraviolet light-emitting devices using nitride semiconductors as new light sources for use in sterilization and water purification, various fields of medicine, quick decomposition of polluting substances, etc.

Inconveniently, however, with the conventional methods mentioned above, in high-Al-content AlGaN ternary alloy growth which is required for the formation of ultraviolet light-emitting devices, the large differences in lattice constant and in thermal expansion coefficient between substrate and epitaxial layer tend to cause development of cracks or a warp in the substrate.

Cracks disrupt the device structure, leading to unsatisfactory characteristics, and reduces the number of acceptable devices obtained from a single wafer, leading to diminished yields. On the other hand, a warp in the substrate not only makes the substrate prone to break during handling, but also makes it difficult, when forming a mask pattern on the substrate in a photolithography step or the like in the device process, to achieve uniform focus across the substrate surface, leading to diminished yields in device fabrication.

Against the background discussed above, in the application of nitride-based compound semiconductors, in particular in their application in the field of light-emitting devices such as LEDs where they are expected to offer wider emission wavelength ranges, there is demand for reduction of cracks and suppression of a warp in the substrate. In particular, in epitaxial growth of high-Al-content eutectic crystals which are required for light emission in an ultraviolet region, there is pressing demand for reduction of dislocations and cracks and suppression of a warp in the substrate.

SUMMARY OF THE INVENTION

The present invention has been made to overcome the inconveniences discussed above, and an object of the invention is to provide a crystal growth method that helps reduce dislocations and suppress development of cracks, and to provide a semiconductor device fabricated by that method.

Another object of the invention is to provide a crystal growth method that helps suppress a warp in a substrate.

Yet another object of the invention is to provide a crystal growth method that helps reduce costs, and to provide a semiconductor device fabricated by that method.

To achieve the above objects, according to a first aspect of the invention, a method of crystal growth includes: a step of heating a substrate; and a step of forming a depressed structure on a surface of the substrate by feeding onto the substrate a source material that reacts with the substrate.

With this crystal growth method according to the first aspect, forming the depressed structure on the substrate surface helps mitigate strain in a group III nitride semiconductor layer formed on the top surface of the substrate. This makes it possible to suppress development of cracks and a warp in the substrate. Moreover, with the above-described crystal growth method according to the first aspect, it is possible to obtain a strong effect of mitigating strain; thus, even in epitaxial growth of a high-Al-content AlGaN ternary alloy required for light emission in an ultraviolet region, it is possible to suppress development of dislocations and cracks and a warp in the substrate.

Moreover, according to the first aspect, feeding the source material onto the heated substrate permits, through a reaction between the substrate and the source material, spontaneous formation of the depressed structure on the substrate surface. Thus, it is possible to form the depressed structure without using a photolithography, etching, or like technology which is commonly used to form a depressed structure. Accordingly, forming the depressed structure does not require going through a separate photolithography, etching, or like step. Thus, even in a case where a depressed structure is formed on the substrate surface, it is possible to suppress an increase in the number of fabrication steps, and thus to reduce fabrication and product costs accordingly. Thus, by forming a semiconductor device by use of the crystal growth method according to the first aspect, it is possible to reduce the costs of the device.

With the scheme described above, it is possible to reduce dislocations and suppress development of cracks, and thus to easily obtain a device that has satisfactory characteristics. In addition, it is possible to increase the number of acceptable devices obtained from a single wafer, and thus to improve yields. Moreover, with the scheme described above, it is also possible to suppress a warp in the substrate, and this too helps improve yields. Improved yields too help reduce costs.

In the above-described crystal growth method according to the first aspect, it is preferable that the substrate be a silicon substrate. In that case, it is preferable that the source material that reacts with the substrate be an organic metal compound containing aluminum. With this scheme, it is possible to easily let the depressed structure form spontaneously on the substrate surface, and thus to easily suppress development of dislocations and cracks and a warp in the substrate. Moreover, a silicon substrate can easily be removed by chemical processing, and thus using a silicon substrate as the substrate makes it possible to remove the substrate easily. This makes it possible to easily obtain a device structure alone with a large area and with reduced scratches. Furthermore, using a silicon substrate as the substrate makes it possible to reduce costs more easily than using a GaN or sapphire substrate as the substrate.

By removing the substrate, it is possible to form, for example, a light-emitting device composed solely of a nitride semiconductor; then, by forming electrodes on the top and bottom sides, respectively, of the device, it is possible to inject current in the vertical direction. That is, it is possible to easily form a so-called vertically structured device.

Here, in a case where the substrate is a sapphire substrate, which is electrically insulating, to construct, for example, a light-emitting diode device (LED), there is no choice but to arrange p-side and an n-side electrodes both on the same side of the substrate, and thus the current path through the device is parallel to the substrate surface, resulting in a so-called horizontal structure. In the horizontal structure, current passes parallel to the active layer, and this limits the light emission area. Inconveniently, this makes it impossible to improve the light output on the basis of so-called scaling up. Also inconveniently, the horizontal structure suffers from higher electrical resistance ascribable to the current path. Even when a sapphire substrate is used, it can be removed, but inconveniently is more difficult to remove than a silicon substrate.

In contrast, by using a silicon substrate as the substrate it is possible to easily overcome the above-mentioned inconveniences encountered when a sapphire substrate is used as the substrate.

In the above-described crystal growth method according to the first aspect, the substrate may be a substrate formed of SiC, ZnO, $Al_xGa_{1-x}N$ (where X is a number in a range of 0 to 1 including 0 and 1), or $Ga_2O_3$. In that case, it is preferable to use, as a reactive gas that reacts with the substrate, a reactive gas containing at least one of hydrogen, oxygen, an organic metal compound, $Cl_2$, methane, and ethane. It is preferable that the organic metal compound contain at least one substance selected from the group consisting of trimethylgallium, trimethylaluminum, triethylaluminum, and triethylgallium.

In the above-described scheme using a silicon substrate, it is preferable that the organic metal compound containing aluminum be trimethylaluminum. And it is preferable that the step of forming the depressed structure include a step of feeding gas containing at least trimethylaluminum onto the silicon substrate to thereby form the depressed structure on the surface of the silicon substrate. With this scheme, it is possible to easily form the depressed structure on the substrate surface by use of the source material that is used to form a nitride semiconductor layer on top of the substrate, and thus it is possible to let the depressed structure form spontaneously as part of the crystal growth process.

In that case, it is preferable that the step of forming the depressed structure include a step of bringing aluminum generated by decomposition of the trimethylaluminum into a eutectic reaction on the surface of the silicon substrate at high temperature to thereby form the depressed structure on the surface of the silicon substrate.

In the above-described scheme including the step of feeding trimethylaluminum onto the silicon substrate, it is preferable that the step of forming the depressed structure include a step of feeding trimethylaluminum onto the silicon substrate at a feed rate of 5 µmol/min or more. By feeding trimethylaluminum onto the silicon substrate at a feed rate of 5 µmol/min or more in this way, it is possible to form the depressed structure on the substrate surface effectively.

In the above-described scheme using a silicon substrate, it is preferable that the principal plane of the silicon substrate be a (111) plane. This scheme offers good lattice match and is expected to offer good orientation because the atomic arrangement on the Si(111) plane in the cubic-system diamond structure is equivalent to that on the (0001) plane in a hexagonal-system group III nitride semiconductor.

In the above-described crystal growth method according to the first aspect, it is preferable that there be further included a step of forming an AlN layer on top of the substrate over the depressed structure.

In that case, it is preferable that the step of forming the AlN layer include a step of forming the AlN layer such that a void remains therein. With this scheme, the AlN layer containing the void functions as a strain-mitigating layer that mitigates strain; thus, in a case where a group III nitride semiconductor layer is formed on top of the AlN layer, even when the group III nitride semiconductor layer has a high Al content (for example, AlN), it is possible to suppress development of dislocations and cracks.

In a case where the AlN layer contains a void, the AlN layer may be formed such that the void is located right over the depressed structure.

In the above-described scheme including the step of forming the AlN layer, there may be further included a step of forming a nitride semiconductor layer on top of the AlN layer in an atmosphere containing hydrogen gas or gas of a compound containing hydrogen.

In the above-described scheme including the step of forming the AlN layer, it is preferable that the step of forming the AlN layer include a step of growing the AlN layer at a growth temperature of 900° C. or more. By growing the AlN layer at a growth temperature of 900° C. or more in this way, it is possible to form a void in the AlN layer effectively. It is further preferable that the growth temperature of the AlN layer be 1000° C. or more.

In the above-described scheme including the step of forming the AlN layer, it is preferable that the step of forming the AlN layer include a step of growing the AlN layer with a thickness of 500 nm or more but 2000 nm or less.

According to a second aspect of the invention, a semiconductor device includes: an AlN layer having a void; and a nitride semiconductor layer formed on top of the AlN layer.

With this semiconductor device according to the second aspect, owing to the provision of the AlN layer having the void as described above, this AlN layer functions as a strain-mitigating layer that mitigates strain, and this makes it possible to obtain a semiconductor device with suppressed development of dislocations and cracks. Moreover, the AlN layer having the void can be formed by the above-described crystal growth method according to the first aspect; thus, by use of the above-described method, it is possible to reduce costs. This makes it possible to realize a low-cost semiconductor device.

In the above-described semiconductor device according to the second aspect, it is preferable that the void in the AlN layer be wedge-shaped.

In the above-described semiconductor device according to the second aspect, preferably, the nitride semiconductor layer includes a light-emitting layer having a quantum well structure. With this structure, it is possible to realize a low-cost semiconductor light-emitting device with suppressed development of dislocations and cracks.

In that case, preferably, the light-emitting layer includes a well layer formed of AlGaN. With this structure, it is possible to realize a low-cost semiconductor light-emitting device that emits light in an ultraviolet region.

In the above-described semiconductor device according to the second aspect, preferably, a first electrode layer is formed on the top side of the AlN layer, and a second electrode layer is formed on the bottom side of the AlN layer. With this structure, it is possible to easily form a vertically structured semiconductor device (for example, a light-emitting diode device). Here, embodying the semiconductor device according to the second aspect as a vertically structured light-emitting diode device makes it possible to increase the device area more easily than embodying it as a horizontally structured light-emitting diode device, and this makes it possible to increase the light output of the light-emitting diode device. Moreover, with the vertical structure, the current path through the device is substantially perpendicular to the substrate surface, and this makes it possible to improve the light output on the basis of scaling up.

In the above-described semiconductor device according to the second aspect, there may be further provided a silicon substrate on top of which the AlN layer is grown. In that case, it is preferable that the silicon substrate have a depressed structure on the surface thereof, and that the void in the AlN layer be located over the depressed structure. The silicon substrate may be removed afterwards by chemical processing or the like.

In the above-described semiconductor device according to the second aspect, the AlN layer containing the void may be removed eventually. In that case, it is preferable that the AlN layer containing the void be removed by dry etching such as RIE. Instead, it may be dissolved away chemically with a liquid such as hot phosphoric acid or molten KOH. While, as mentioned above, the AlN layer containing the void exerts an effect of mitigating strain and suppressing cracks when the device structure is grown on top of the substrate, it can also cause an increase in the driving voltage in a case where the substrate is removed before the device is completed. Thus, by removing the substrate and also the AlN layer, it is possible to reduce the driving voltage of the device and improve the wall-plug efficiency (the ratio of the light output to the electric power fed into the device; the higher the value, the lower the loss in the device and the higher the energy efficiency, which are preferable characteristics of the device).

As described above, according to the invention, it is possible to easily obtain a crystal growth method and a semiconductor device that help suppress development of dislocations and cracks, fabricated by that method.

Moreover, according to the invention, it is possible to easily obtain a crystal growth method that helps suppress a warp in a substrate.

Furthermore, according to the invention, it is possible to easily obtain a crystal growth method and a semiconductor device that help reduce costs.

BRIEF DESCRIPTION OF THE DRAWINGS

FIG. 9A is a microscope photograph of the surface of a sample according to the practical example (sample B) as observed under an optical microscope;

FIG. 9B is a microscope photograph of the surface of a sample according to comparative example 1 (sample C) as observed under an optical microscope;

FIG. 9C is a microscope photograph of the surface of a sample according to comparative example 2 (sample D) as observed under an optical microscope;

DETAILED DESCRIPTION OF PREFERRED EMBODIMENTS

Embodiments of the present invention will be described below with reference to the accompanying drawings. The first embodiment will deal with a method of crystal growth of a group III nitride semiconductor. The second and third embodiments will deal with examples in which the invention is applied to light-emitting diode devices as an example of a semiconductor device according to the invention.

Embodiment 1

As discussed earlier, crystal growth of a group III nitride semiconductor is liable to encounter development of cracks or a warp in the substrate. In particular, in the fabrication of ultraviolet light-emitting devices that emit light in an ultraviolet region, a nitride semiconductor layer with a high Al content needs to be formed with a comparatively large thickness, and this makes development of dislocations and cracks, and of a warp in the substrate, extremely likely.

Through intensive studies in search of a solution to the above problem, the present inventors have found that, when a material that reacts with a substrate is fed onto the substrate before crystal growth, a depressed structure forms spontaneously on the substrate surface. The inventors have further found that, by forming a nitride semiconductor layer on top of a substrate having such a depressed structure formed on it, it is possible to form a high-Al-content nitride semiconductor layer that is crack-free.

The inventors have also found that, by using a silicon substrate as the above substrate and using TMA (trimethylaluminum) as the material that reacts with the substrate, it is possible to easily form a depressed structure on the substrate surface. That is, considering that silicon (Si) and aluminum (Al) form a eutectic crystal under appropriate temperature and other conditions, the inventors have found that, by exploiting that eutectic crystal formation purposefully, it is possible to easily form a crack-free AlN layer, high-Al-content AlGaN layer, or like layer on the substrate.

On the other hand, when a semiconductor light-emitting device having a multiple-layer structure including a crack-free, high-Al-content nitride semiconductor layer as described above is fabricated and is operated, since the AlN layer which is required at an initial stage of crystal growth has a high electrical resistance, the device requires an increased driving voltages. The inventors, however, have also found that, by removing the AlN buffer layer as well by dry etching or by etching using a liquid subsequent to removal of the substrate, it is possible to easily reduce the driving voltage. With this technology, it is possible to fabricate a device structure having a multiple-layer structure of a crack-free, high-quality, high-Al-content crystal, and in addition to reduce the driving voltage.

By feeding a group V material such as $NH_3$ subsequently to the feeding of gas containing TMA, it is possible to epitaxially grow a group III nitride semiconductor monocrystal on top.

Figure 1:
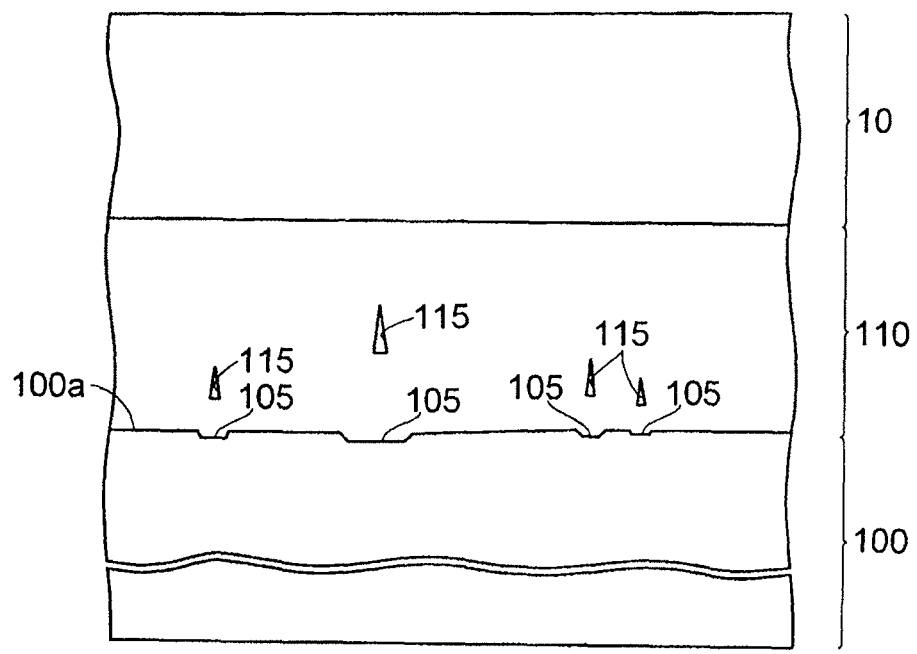
FIG. 1 is a sectional view illustrating a crystal growth method according to Embodiment 1 of the invention (a diagram obtained by tracing the section photograph of FIG. 8)
Figure 2:
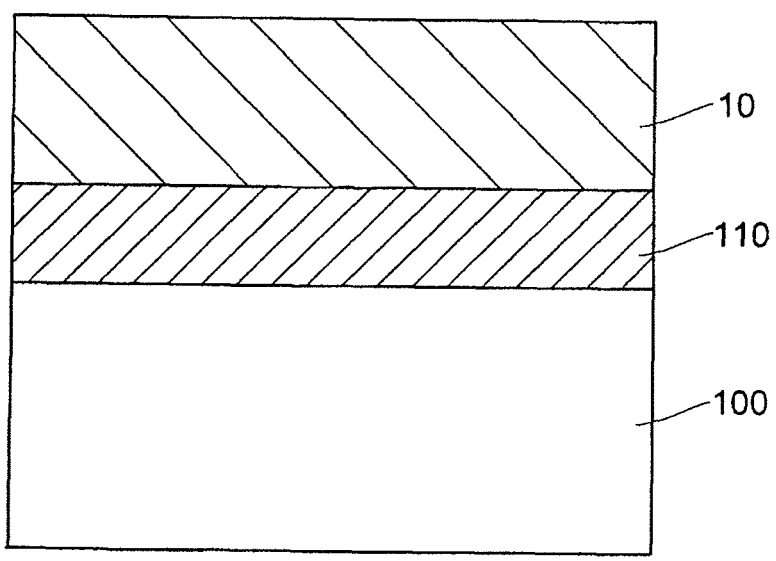
FIG. 2 is a sectional view illustrating the crystal growth method according to Embodiment 1 of the invention.
Figure 3:
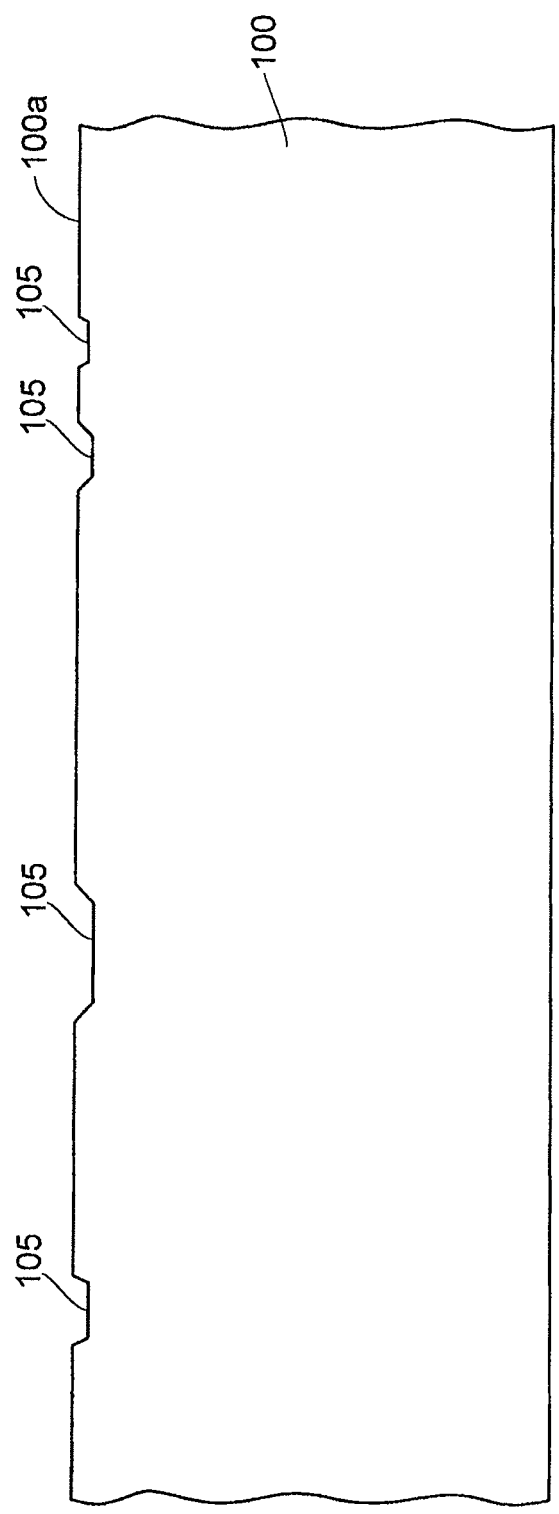
FIG. 3 is a sectional view illustrating the crystal growth method according to Embodiment 1 of the invention.

Now, with reference to FIGS. 1 to 3, a method of crystal growth of a group III nitride semiconductor according to a first embodiment (Embodiment 1) of the invention will be described in detail. FIGS. 1 to 3 are sectional views illustrating the crystal growth method according to Embodiment 1 of the invention. Embodiment 1 only deals with steps of growing, on top of a substrate, an AlN buffer layer and a nitride semiconductor layer (AlGaN layer) in this order.

As shown in FIGS. 1 and 2, in Embodiment 1, a silicon substrate 100 is used as the substrate, and on top of this silicon substrate 100, an AlN buffer layer 110 and an AlGaN layer 10 are grown in this order by an epitaxial growth method such as a MOCVD method. The silicon substrate 100 is an example of a "substrate" according to the invention, and the AlN buffer layer 110 is an example of an "AlN" layer according to the invention. The AlGaN layer 10 is an example of a "nitride semiconductor layer" according to the invention.

Specifically, first, a silicon substrate 100 is prepared as a substrate on which to grow a group III nitride semiconductor, and the silicon substrate 100 is placed inside the reactor of an ordinary MOCVD machine.

It is preferable that the principal plane of the silicon substrate 100 be the (111) plane. The atomic arrangement on the (0001) plane of a hexagonal-system group III nitride semiconductor is equivalent to that on the Si (111) plane of the cubic-system diamond structure; this results in good lattice match, and is expected to offer good orientation. The good orientation is considered to result from the fact that all the topmost dangling bonds on the Si (111) plane point in the direction perpendicular to the surface. Usable as the silicon substrate 100 is, for example, one with a diameter of 2 inches.

Next, the silicon substrate 100 placed inside the reactor is heated up to about 1000° C.

Here, in Embodiment 1, before a nitride semiconductor layer is grown on top of the substrate, with the silicon substrate 100 heated, TMA, which is a source material for Al, is fed in advance. Specifically, first, the silicon substrate 100 is held until its temperature stabilizes at the set temperature of 1000° C.; after the temperature stabilizes at the set temperature, 20 µmol of TMA is fed in advance for 150 seconds. At this time, no $NH_3$, which is a source material for N (nitrogen) is fed. This initiates a eutectic reaction between silicon (Si) and aluminum (Al) to produce, on the surface of the silicon substrate 100, depressed structures 105 having side walls inclined relative to the substrate surface as shown in FIGS. 1 and 3. It is preferable that the feed rate of the TMA fed in advance be 5 µmol/min or more.

Subsequently, with TMA kept being fed, ammonia ($NH_3$) starts to be fed, so that, on the top surface of the silicon substrate 100 having the depressed structures 105 formed on it, an AlN layer as a buffer layer (the AlN buffer layer 110) is grown to have a thickness of, for example, about 600 nm. Here, it is preferable that the growth temperature of the AlN buffer layer 110 be 900° C. or more, and further preferably 1000° C. or more. It is preferable that the thickness of the AlN buffer layer 110 be 500 nm or more but 2000 nm (2 µm) or less.

Here, forming the AlN buffer layer 110 on the top surface of the silicon substrate 100 having the depressed structures 105 formed on it produces, as shown in FIG. 1, wedge-shaped voids (hollow parts) 115 in the AlN buffer layer 110. The voids 115 are formed right over the depressed structures 105.

Thereafter, TMG (trymethylgallium), which is a source material of gallium (Ga) is additionally fed at a feed rate of 20 μmol/min, so that, on top of the AlN buffer layer 110, an AlGaN layer 10 with an Al content of about 40% is formed to have a thickness of, for example, about 800 nm.

Lastly, the feeding of TMA and TMG is stopped, and the product is cooled down to room temperature in an atmosphere containing ammonia. After the cooling, the substrate is taken out of the reactor.

Although in Embodiment 1, the substrate is taken out of the reactor after the AlGaN layer 10 has been grown on top of the silicon substrate 100, in actual fabrication of a particular device (for example, a light-emitting device such as an LED), further nitride semiconductor layers continue to be formed on top of the AlGaN layer 10.

Figure 4:
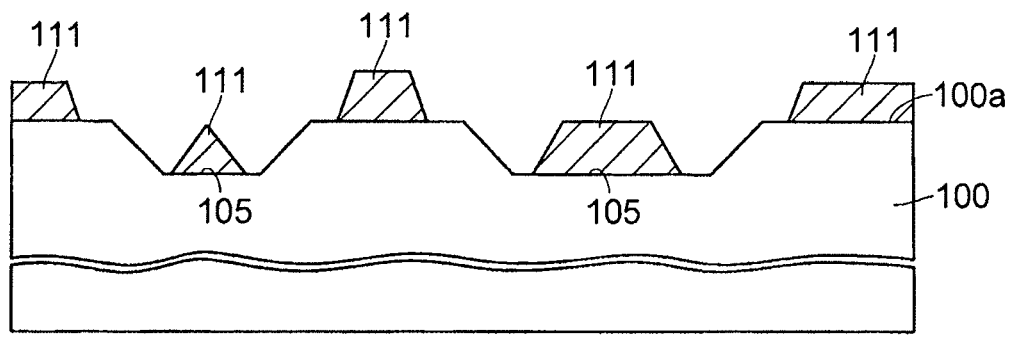
FIG. 4 is a schematic sectional view illustrating formation of voids in the crystal growth method according to Embodiment 1.
Figure 5:
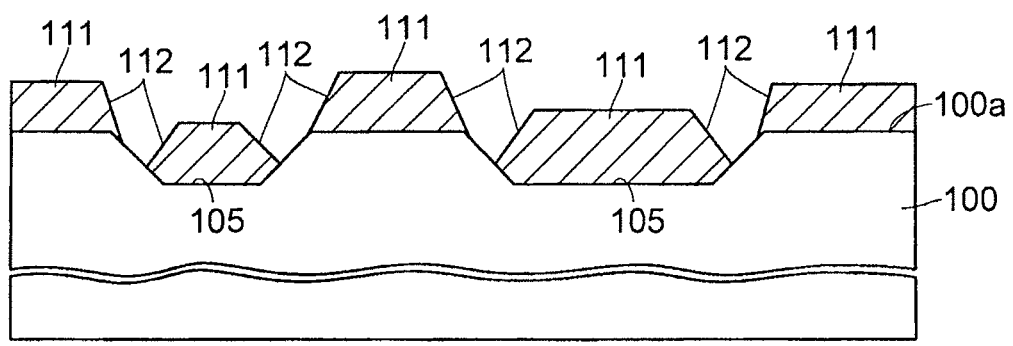
FIG. 5 is a schematic sectional view illustrating formation of voids in the crystal growth method according to Embodiment 1.
Figure 6:
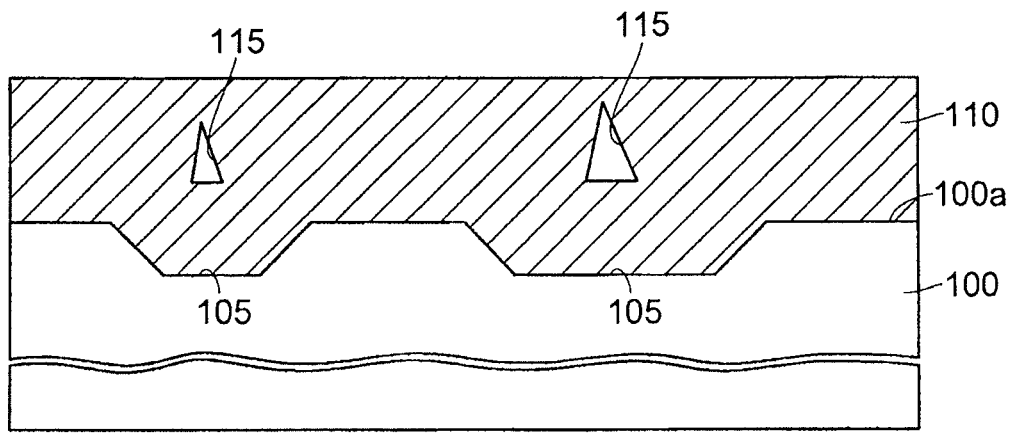
FIG. 6 is a schematic sectional view illustrating formation of voids in the crystal growth method according to Embodiment 1.

FIGS. 4 to 6 are schematic sectional views illustrating the formation of voids in the crystal growth method according to Embodiment 1. Next, with reference to FIGS. 4 to 6, the formation of voids in the AlN buffer layer 110 formed on top of the silicon substrate 100 will be described.

As shown in FIG. 4, feeding NH$_3$ along with TMA onto the silicon substrate 100 having the depressed structures 105 formed on it causes AlN 111 to start to grow starting at the topmost surface 100a of the silicon substrate 100 and the bottom of the depressed structures 105. Subsequently, as shown in FIG. 5, as time passes, facets 112 appear, and the facets 112 grow in the horizontal direction (lateral growth). Then, as shown in FIG. 6, facets growing from opposite directions meet, and where they meet, wedge-shaped voids 115 form. This is considered to be how the voids 115 form.

In the crystal growth method according to Embodiment 1, as described above, a silicon substrate 100 is used, and while it is kept heated before growth of a group III nitride semiconductor layer, gas containing TMA is fed in advance onto the substrate surface; in this way, it is possible to bring Al separated from TMA and Si in the silicon substrate 100 into an eutectic reaction. This makes it possible to let depressed structures 105 form spontaneously on the surface of the silicon substrate 100. That is, it is possible, without subjecting the silicon substrate 100 itself to any additional processing step, to let depressed structures 105 form spontaneously on the substrate surface in the course of a sequence of crystal growth. Since TMA is a source material for the growth of a nitride semiconductor layer, its advance-feeding can be done as part of a crystal growth process by a MOCVD method.

Moreover, by growing an AlN buffer layer 110 on top of the silicon substrate 100 having the depressed structures 105 formed on it, it is possible to form wedge-shaped voids 115 to in the AlN buffer layer 110, at positions right above the depressed structures 105. These voids 115 exert an effect of mitigating strain (stress), and this makes it possible to grow an AlGaN layer 10, which is formed subsequently on top of the AlN buffer layer 110, crack-free.

Moreover, owing to the AlN buffer layer 110 having the voids 115 functioning as a strain-mitigating layer, it is possible to mitigate strain resulting from differences in lattice constant and in thermal expansion coefficient between the silicon substrate 100 and a group III nitride semiconductor layer (in Embodiment 1, the AlGaN layer 10) formed on top of the AlN buffer layer 110. This makes it possible to obtain a strong effect of mitigating strain, and thus, even in a case where the Al content in the nitride semiconductor layer formed on top of the AlN buffer layer 110 is high, it is possible to suppress development of dislocations and cracks and a warp in the substrate. Thus, even in epitaxial growth of a high-Al-content AlGaN ternary alloy required for light emission in an ultraviolet region, it is possible to perform crystal growth while suppressing development dislocations and cracks etc. This makes it possible to easily fabricate a light-emitting device that emits light in an ultraviolet region.

There are various methods that are considered to be usable to form depressed structures on the silicon substrate, common among which are those relying on a photolithography or dry or wet etching technology. With the crystal growth method according to Embodiment 1, however, once the substrate is placed inside a crystal growth machine, the depressed structures 105 form spontaneously as part of the growth process. Thus, forming the depressed structures 105 does not require going through a separate photolithography or etching step. Thus, even in a case where depressed structures 105 are formed on the substrate surface, it can be done with no increase in the number of fabrication steps. It is thus possible to reduce fabrication and product costs accordingly. Thus, by forming a semiconductor device by the crystal growth method described above, it is possible to fabricate it at low costs.

There are also various methods that are usable to form voids in the group III nitride semiconductor layer, according to one of which, after the depressed structures 105 are formed on the silicon substrate 100, by growing an AlN buffer layer 110, which allows easy formation of facets, it is possible to easily form the voids 115 in the layer. Thus, by a method like this, it is possible to form, stably and with good control, voids 115 that are so structured as to mitigate strain sufficiently. In particular, by selecting appropriate conditions in the process of forming the depressed structures 105 on the surface of the silicon substrate 100, it is possible to obtain the desired porosity (proportion of voids) with good control.

Moreover, in Embodiment 1, owing to the depressed structures 105 forming spontaneously on the surface of the silicon substrate 100 and the minute voids 115 forming densely right over them, it is possible to obtain a more remarkable effect of mitigating strain.

Moreover, in Embodiment 1, by the crystal growth method described above, it is possible to suppress development of dislocations and cracks, and it is thus possible to easily obtain devices with satisfactory characteristics. In addition, it is possible to increase the number of acceptable devices obtained from a single wafer, and it is thereby possible to increase yields. Moreover, with the structure described above, it is also possible to suppress a warp in the substrate, and this too helps increase yields. Improved yields too help reduce costs.

Moreover, in Embodiment 1, using a silicon substrate 100 as the substrate makes it possible to react it with Al in TMA, and it is thus possible to easily let the depressed structures 105 form spontaneously on the substrate surface. This makes it possible to easily suppress development of dislocations and cracks and a warp in the substrate.

Moreover, in Embodiment 1, by feeding TMA in advance at a feed rate of 5 μmol/min or more onto the silicon substrate 100, it is possible to effectively form the depressed structures 105 on the substrate surface.

Moreover, a silicon substrate 100 can easily be removed by chemical processing, and therefore using a silicon substrate 100 as the substrate makes it possible to remove the substrate easily. Specifically, when a silicon substrate 100 is used as the substrate, owing to the difference in stability with a chemical liquid between it and the nitride semiconductor, it is possible to remove the substrate easily. Thus, after the device structure is formed on top of the substrate, by removing the substrate, it is possible to easily obtain the device structure alone which has a large area and has reduced cracks and scratches.

Furthermore, owing to the depressed structures 105 being formed on the silicon substrate 100, for example, when etching using a chemical liquid is performed, the chemical liquid more easily permeates into the silicon substrate 100, making the removal of the silicon substrate 100 easier.

Using a silicon substrate as the substrate also makes it possible to reduce costs more easily than using a GaN substrate or a sapphire substrate as the substrate.

Moreover, in Embodiment 1, the use of the (111) plane as the principal plane of the silicon substrate 100, since the atomic arrangement on the Si(111) plane of the cubic-system diamond structure is equivalent to that on the (0001) plane of a hexagonal-system group III nitride semiconductor, results in good lattice match, and is expected to offer good orientation.

Moreover, in Embodiment 1, by forming the AlN buffer layer 110 at a growth temperature of 900° C. or more (for example, about 1000° C.), it is possible to effectively form the voids 115 in the AlN buffer layer 110.

It is preferable that the thickness of the AlN buffer layer 110 be such as to fill the depressed structures 105 on the silicon substrate 100 and to make the layer surface flat immediately before the growth of the AlGaN layer 10. Specifically, it is preferable that the thickness of the AlN buffer layer 110 be 500 nm or more but 2000 nm or less.

To verify the effects of the crystal growth method according to Embodiment 1, samples fabricated by the crystal growth method described above were subjected to inspections and experiments.

Figure 7A:
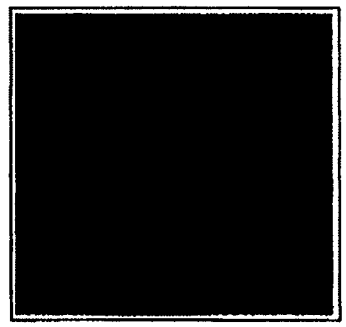
FIG. 7A is a microscope photograph of the surface of a sample according to a practical example (sample B) as observed under an optical microscope (an optical microscope photograph of the surface of a sample according to the practical example (sample B))
Figure 7B:
FIG. 7B is a microscope photograph of the surface of a sample according to the practical example (sample B) as observed under an optical microscope (an optical microscope photograph of the surface of a sample (the surface of the AlGaN layer) according to the practical example (sample B))
Figure 7C:
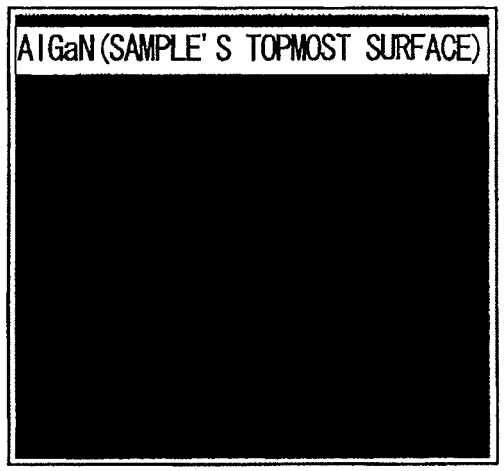
FIG. 7C is a microscope photograph of the surface of a sample according to the practical example (sample B) as observed under an optical microscope (an optical microscope photograph of the surface of the AlN buffer layer in a sample according to the practical example (sample B))

Specifically, first, the surface of a sample fabricated as a practical example (sample B) by the crystal growth method described above was inspected under an optical microscope. Used as the silicon substrate was one with a diameter of 2 inches. FIGS. 7A, 7B, and 7C are microscope photographs of the surface of the sample according to the practical example (sample B) as observed under an optical microscope. FIG. 7A is a microscope photograph of the surface of the sample according to the practical example (sample B); FIG. 7B is a microscope photograph of the surface of the AlGaN layer in the sample according to the practical example (sample B); and FIG. 7C is a microscope photograph of the surface of the AlN buffer layer in the sample according to the practical example (sample B).

As FIG. 7A shows, with the sample according to the practical example which was fabricated by the crystal growth method described above, the surface was observed to have no cracks all over the entire surface of the 2-inch-across silicon substrate. The pattern seen in FIG. 7A was one showing the structure of the silicon substrate surface and inside the AlN buffer layer as seen through the transparent AlGaN layer, and the topmost surface of the AlGaN layer itself was flat.

Moreover, in the optical microscope photographs of the sample according to the practical example, there were two focal points in the direction of the depth (thickness) of the film. As shown in FIGS. 7B and 7C, the two focal points correspond respectively to the surface of the MN buffer later and the topmost surface (the surface of the AlGaN layer).

As a comparative example, another sample (sample A) was fabricated in which the same layer structure as in the practical example (sample B) was formed but under the condition that no TMA was fed in advance, and was inspected, as the practical example was, under an optical microscope. In the sample according to the comparative example (sample A), its surface was covered with numberless cracks.

This verified that the advance-feeding of TMA exerted an effect of suppressing cracks.

Figure 8:
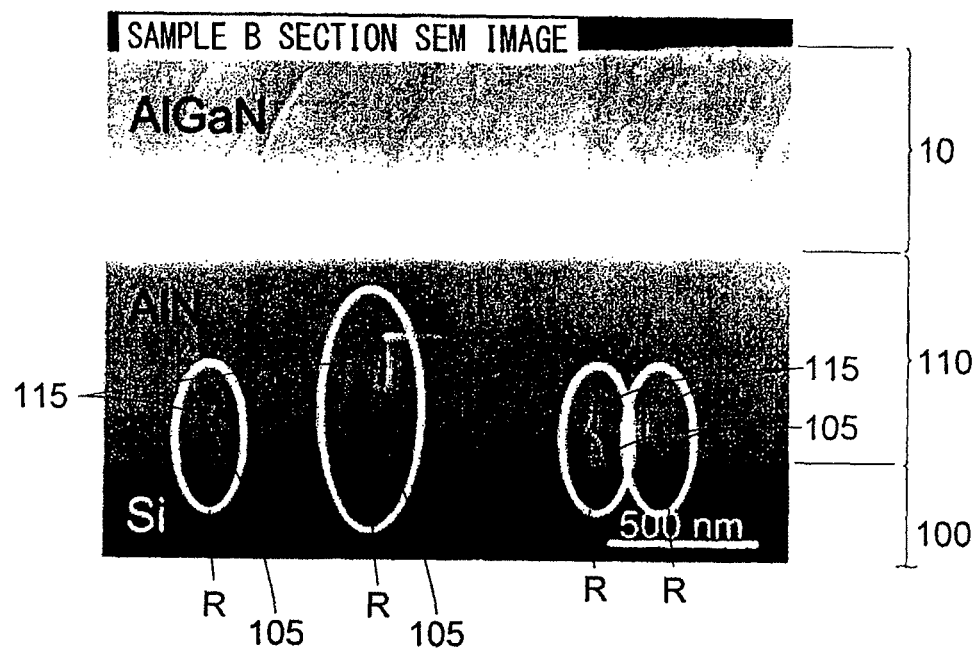
FIG. 8 is a microscope photograph of a section of a sample according to the practical example (sample B) as observed under a SEM.

A section of the sample according to the practical example (sample B) was inspected under a SEM (scanning electronic microscope). FIG. 8 is a microscope photograph of a section of the sample according to the practical example (sample B) as observed under a SEM.

As FIG. 8 shows, depressed structures 105 were observed on the surface of the silicon substrate 100. These depressed structures 105 had inclined side walls. It was also confirmed that, in the AlN buffer layer 110, over the depressed structures 105, minute wedge-shaped voids 115 were formed. The high-Al-content AlGaN layer 10 grown on top of the AlN buffer layer 110 was, as noted above, crack-free.

Moreover, through inspection of sections at different positions of the sample according to the practical example (sample B), a strong correlation was recognized between the positions of the depressed structures 105 formed on the surface of the silicon substrate 100 and the positions of the voids 115 formed in the AlN buffer layer 110, and it was revealed that the voids 115 were located right over the depressed structures 105 with a probability of about 100% (see the areas indicated by circles R in FIG. 8).

Also recognized was a correlation between the width of the depressed structures 105 on the surface of the silicon substrate 100 and the width of the voids 115 in the AlN buffer layer 110. Specifically, the larger the width of the depressed structures 105 was, the larger the width of the voids 115 tended to be, and so did the height of the voids 115 (its height from the surface of the silicon substrate 100). This suggests that the presence of the depressed structures 105 having side walls inclined relative to the substrate surface caused the AlN layer as the buffer layer to grow laterally, in particular at the initial stage of growth. That is, it is considered as follows: as shown in FIGS. 4 to 6, AlN 111 starts to grow starting at the topmost surface 100a of the silicon substrate 100 and the bottom of the depressed structures 105; as time passes, facets 112 appear and grow laterally until facets growing from opposite directions meet, where voids 115 form. This is endorsed also by the relationship between growth temperature and the voids.

Through further experiments conducted by the present inventors, it was found that, when an AlN buffer layer was grown by use of a substrate having depressed structures, growing the AlN buffer at a growth temperature of 900° C. or more made it possible to effectively form voids in the AlN buffer.

On the other hand, when no voids were formed in the AlN buffer layer, the absence of voids was made up for by development of numberless cracks in the AlGaN layer grown on top of the AlN buffer layer. The fact that growing the AlN buffer layer at a growth temperature of 900° C. or more permits effective formation of voids in this way indicates that the migration length of Al as a group III source material on the substrate surface or on the grown layer surface, that is, lateral growth, is involved in the formation of voids.

Even when the AlN buffer layer is grown at 900° C. or more, unless depressed structures are formed on the substrate surface, dislocations and cracks do develop in the AlGaN layer on top of the AlN buffer. This result indicates that, for suppression of cracks, it is essential that voids be formed in the AlN buffer layer. It can also be said that the requirements for the formation of voids are that depressed structures be formed on the substrate surface, and that the lateral growth of the AlN buffer layer be controlled properly.

Yet another comparative examples were fabricated: a sample according to comparative example 1 (sample C) in which the growth temperature of the AlN buffer layer was lower than in the practical example; and a sample according to comparative example 2 (sample D) in which the advance-feed rate of TMA was lower than in the practical example. These samples were compared with the sample according to the practical example (sample B). In the sample according to the comparative example 1 (sample C), the growth temperature of the AlN buffer layer was 850° C. In the sample according to the comparative example 2 (sample D), the advance-feed rate of TMA was 2 μmol/min. In the sample according to the practical example (sample B), which was crack-free, the growth temperature of the AlN buffer layer was 1000° C., and the advance-feed rate of TMA was 8 μmol/min.

The results are shown in FIGS. 9A, 9B, and 9C and in Table 1. FIG. 9A is a microscope photograph of the surface of the sample according to the practical example (sample B) as observed under an optical microscope; FIG. 9B is a microscope photograph of the surface of the sample according to comparative example 1 (sample C) as observed under an optical microscope; and FIG. 9C is a microscope photograph of the surface of the sample according to comparative example 2 (sample D) as observed under an optical microscope.

TABLE 1

|  | XRC FWHM (arcsec) | | | | PL | | Cracks |
|---|---|---|---|---|---|---|---|
|  | AlN (002) | AlGaN (002) | AlN (102) | AlGaN Al Content | Peak Wavelength (nm) | Peak Intensity (count) | (Central Part) |
| Practical Example 1 (Sample B) | 1000 | 1000 | 1970 | 0.50 | 275 | 406 | No |
| Comparative Example 1 (Sample C) | 1370 | 1280 | 3020 | 0.46 | 271 | 144 | Yes |
| Comparative Example 2 (Sample D) | 1550 | 1560 | 4280 | 0.47 | 273 | 91 | Yes |

Table 1 reveals the following. In the practical example (sample B), the full width at half maximum (FWHM) values of the X-ray rocking curve (XRC) were 1000 arcsec with AlN (002), 1000 arcsec with AlGaN (002), and 1970 arcsec with AlN (102). In contrast, in comparative example 1 (sample C), the full width at half maximum values of the X-ray rocking curve were 1370 arcsec with AlN (002), 1280 arcsec with AlGaN (002), and 3020 arcsec with AlN (102) and, in comparative example 2 (sample D), the full width at half maximum values of the X-ray rocking curve were 1550 arcsec with AlN (002), 1560 arcsec with AlGaN (002), and 4280 arcsec with AlN (102).

It is generally known that, in an XRC, the FWHM value for reflection on a symmetric plane (002) increases in proportion to the density of screw dislocations while the FWHM value for reflection on an asymmetric plane (102) increases in proportion to the density of edge dislocations; hence, from the FWHM values for those different classes of reflection, it is possible to estimate an increase or decrease in screw dislocations and in edge dislocations. The results indicate a decrease in both screw dislocations and edge dislocations, which are kinds of crystal defect, in practical example 1 (sample B) compared with in comparative examples 1 and 2 (samples C and D), and that practical example 1 (sample B) is superior to samples C and D not only in development of cracks but also in crystal quality.

The Al content in the AlGaN layer grown on top of the AlN buffer layer was 0.50 in the practical example, 0.46 in comparative example 1, and 0.47 in comparative example 2. Moreover, the peak wavelength in PL (photoluminescence) by excimer laser pulse excitation at an wavelength of 190 nm was about 275 in all of the practical example and comparative examples 1 and 2, and this agrees with the fact the Al content is almost equal in all the samples. However, the practical example offered a higher peak wavelength than comparative examples 1 and 2. This result indicates that the practical example 1 (sample B), comparative example 1 (sample C), and comparative example 2 (sample D) have increasing non-radiative recombination center densities in this order, and agrees well with the increasing FWHM values in the XRC. That is, it indicates that the density of non-radiative recombination centers in PL correlates with the density of dislocations (screw and edge dislocations), practical example 1 (sample B) having the lowest non-radiative recombination center density (which means good crystallinity), and comparative example 1 (sample C) and comparative example 2 (sample D) having higher, and increasingly high, densities. This result leads to the conclusion that the growth temperature of the AlN buffer layer and the advance-feed rate of TMA have a strong correlation with crystal quality.

Moreover, as shown in FIGS. 9A to 9C, while in the practical example (see FIG. 9A), no development of cracks on the sample surface was recognized as mentioned above, in both comparative examples 1 and 2 (see FIGS. 9B and 9C respectively), development of cracks was recognized.

As described above, a low growth temperature of the AlN buffer layer or a low advance-feed rate of TMA tended to diminish the effect of suppressing cracks.

Through studies, the present inventors have found that it is preferable that the advance-feed rate of TMA be 5 μmol/min or more, because doing so makes it possible to effectively form depressed structures on the substrate surface. With a TMA feed rate less than 5 μmol/min, on the substrate surface, the eutectic reaction does not progress to a degree sufficient to form depressed structures there. This is considered to be the reason that comparative example 2 exhibited a diminished effect of suppressing cracks. Moreover, as mentioned above, it is preferable that the growth temperature of the AlN buffer layer be 900° C. or more. Accordingly, to obtain a remarkable effect of suppressing cracks and a warp in the substrate, it is preferable that the growth temperature of the AlN buffer layer be 900° C. or more, and that the advance-feed rate of TMA be 5 μmol/min or more.

As described above, using a silicon substrate as a substrate and feeding TAM in advance allows depressed structures to form spontaneously on the substrate surface and permits an AlN buffer layer grown on top so as to have voids to function as a strain-mitigating layer. This, it has been confirmed, offers a powerful effect of suppressing cracks. It has also been confirmed that, to obtain a remarkable effect of suppressing cracks, it is preferable that the advance-feed rate of TMA be 5 μmol/min or more, and that the growth temperature of the AlN buffer layer be 900° C. or more. Thus, it has been confirmed that, with the crystal growth method according to Embodiment 1 described above, it is possible to grow a high-Al-content group III nitride semiconductor layer (an AlGaN, AlN, or like layer with a high Al content) on an AlN buffer layer without developing dislocations or cracks.

The size and number of depressed structures formed can be controlled by appropriately adjusting the substrate temperature, the feed rate of TMA, etc.; by controlling the depressed structures and otherwise, the size and density of voids in the AlN buffer layer can be controlled.

Embodiment 2

Figure 10:
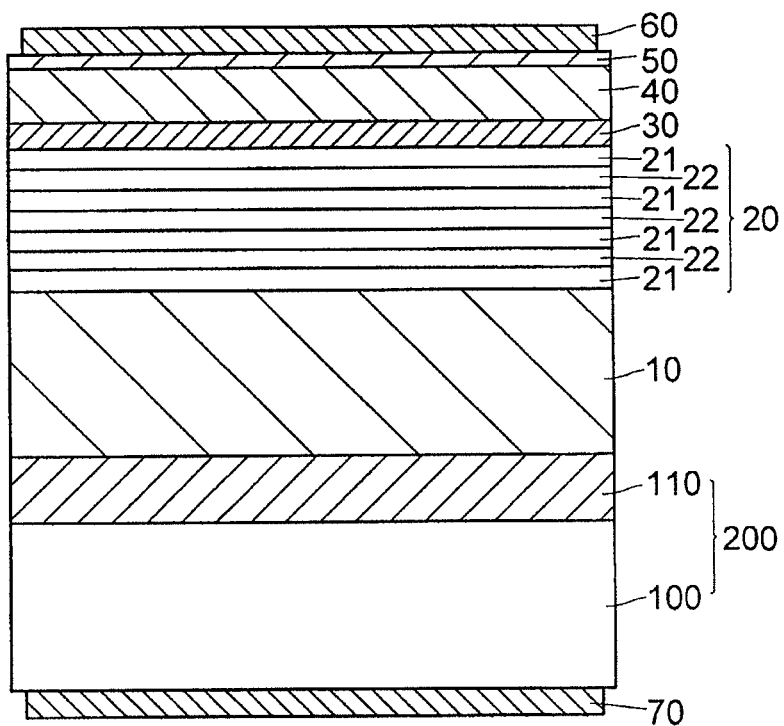
FIG. 10 is a sectional view of a light-emitting diode device according to Embodiment 2 of the invention.

FIG. 10 is a sectional view of a light-emitting diode device according to a second embodiment (Embodiment 2) of the invention. Next, with reference to FIGS. 1 and 10, the light-emitting diode device (semiconductor device) according to Embodiment 2 of the invention will be described.

The light-emitting diode device according to Embodiment 2 is an ultraviolet light-emitting device that emits light in an ultraviolet region, and more particularly a far-ultraviolet light-emitting device that emits light in a far-ultraviolet region of 200 nm to 350 nm. This light-emitting diode device is provided with a template substrate 200 which has an AlN buffer layer 110 formed on top of a silicon substrate 100, and has a plurality of nitride semiconductor layers stacked on top of the template substrate 200. In the light-emitting diode device according to Embodiment 2, formed on top of the AlN buffer layer 110 of the template substrate 200 are high-Al-content nitride semiconductor layers.

The template substrate 200 is grown by the crystal growth method according to Embodiment 1 describe previously, and as shown in FIG. 1, depressed structures 105 are formed on the surface of the silicon substrate 100. Moreover, in the AlN buffer layer 110 formed on top of the silicon substrate 100, at positions right above the depressed structures 105, wedge-shaped voids 115 are formed.

As shown in FIG. 10, on top of the template substrate 200 (the AlN buffer layer 110), an n-type AlGaN layer 10 with a thickness of about 0.5 μm to about 1.5 μm is formed. The Al content in the AlGaN layer 10 is set at, for example, about 0.8 to 0.9.

Here, in Embodiment 2, using the template substrate 200 formed by the crystal growth method according to Embodiment 1 permits the AlN buffer layer 110 having the voids 115 (see FIG. 1) to function as a strain-mitigating layer. This makes it possible to form a crack-free nitride semiconductor layers on top of the AlN buffer layer 110. Thus, although the n-type AlGaN layer 10 is formed with an extremely high Al content and with a comparatively large thickness, the AlGaN layer 10 is formed on top of the AlN buffer layer 110 with development of dislocations and cracks suppressed.

Moreover, on top of the n-type AlGaN layer 10, a light-emitting layer (active layer) 20 having a quantum well structure is formed. The light-emitting layer 20 is composed of barrier layers 21 of AlGaN with a thickness of about 2 nm to about 10 nm and well layers 22 of AlGaN with a thickness of about 2 nm to about 20 nm stacked alternately. Moreover, the Al content in the well layers 22 in the light-emitting layer 20 is set to be larger than that in the barrier layers 21. Specifically, the Al content in the well layers 22 is set at, for example, about 0.8 to about 0.9. The Al content in the barrier layers 21 is set to be smaller than that in the well layers 22, for example about 0.7 to about 0.78. The number of cycles in which the barrier layers 21 and the well layers 22 recur may be set as desired, preferably, for example, 1 to 3 cycles. FIG. 10 shows, as an example, a case in which the number of cycles of recurrence is three.

On the top surface of the light-emitting layer 20, a carrier block layer 30 of p-type AlGaN with a thickness of about 5 nm to about 15 nm is formed. The Al content in this carrier block layer 30 is set at, for example, 0.9 to 1.0. With an Al content of 1.0, the carrier block layer 30 is a layer of p-type AlN.

On top of the carrier block layer 30, a p-type AlGaN 40 with a thickness of about 2 nm to about 20 nm is formed. The Al content in this p-type AlGaN 40 is set at, for example, about 0.8 to about 0.9. On top of the p-type AlGaN 40, a p-type contract layer 50 of p-type GaN with a thickness of about 30 nm to about 60 nm is formed.

An n-type nitride semiconductor is doped with, for example, Si as an n-type dopant, and a p-type nitride semiconductor is doped with, for example, Mg as a p-type dopant On top of the p-type contract layer 50, a p-side electrode 60 is formed. The p-side electrode 60 is, for example, a Ni/Au electrode of a multiple layer structure having a Ni layer (not shown) and a Au layer (not shown) stacked in this order from the p-type contract layer 50 side.

In Embodiment 2, the template substrate 200 is an electrically conductive substrate, and on the back surface of the template substrate 200 (silicon substrate 100), an n-side electrode 70 is formed. The n-side electrode 70 is, for example, an Al electrode, or a Ag/Cu electrode of a multiple layer structure having a Ag layer and a Cu layer stacked in this order from the substrate side. The p-side electrode 60 is an example of a "first electrode layer" according to the invention, and the n-side electrode 70 is an example of a "second electrode layer" according to the invention.

As described above, the light-emitting diode device according to Embodiment 2 has electrodes (the p-side electrode 60 and the n-side electrode 70) formed on the top side and bottom side, respectively, of the template substrate 200 (AlN buffer layer 110), thus forming a so-called vertical structure.

Moreover, the light-emitting diode device according the Embodiment 2 can be formed by growing, on top of the silicon substrate 10, first an AlN buffer layer 110 and subsequently nitride semiconductor layers, by use of a MOCVD method or the like. Moreover, the growth of the nitride semiconductor layers formed on top of the AlN buffer layer 110 can be done in an atmosphere containing hydrogen gas or a compound gas containing hydrogen.

As described above, in Embodiment 2, stacking a plurality of nitride semiconductor layers on top of a template substrate 200 provided with an AlN buffer layer 110 having voids 115 permits the AlN buffer layer 110 to function as a strain-mitigating layer. Thus, it is possible to obtain a light-emitting diode device with suppressed development of dislocations and cracks. The AlN buffer layer 110 has so powerful an effect of mitigating strain that it permits, even in epitaxial growth of a high-Al-content eutectic crystal required for light emission in an ultraviolet region, crystal growth while suppressing development of cracks and the like. This makes it possible to form a crack-free far-ultraviolet light-emitting device that emits light in a far-ultraviolet wavelength region.

Moreover, in Embodiment 2, the use of an electrically conductive substrate allows adoption of a vertical structure, and this makes the current path through the device substantially perpendicular to the substrate surface. This makes it possible to increase the light output on the basis of scaling up. In addition, it is possible to suppress current concentration and the like, and thus to make the electrical resistance low. Furthermore, it is possible to easily increase the emission area of the light-emitting layer 20 (active layer), and to obtain uniform light emission. It is also possible to increase the area easily, and thus to increase the light output easily.

Moreover, whereas a horizontal structure, in which an n-side and a p-side electrode are formed on the same side of a substrate, requires removal of part of nitride semiconductor layers (a stacked structure) to form one of the electrodes (n-side electrode), the vertical structure does not require such processing. This makes it possible to reduce processing costs, and to reduce the number of fabrication processes (steps).

In Embodiment 2, using a silicon substrate 100 as a substrate makes it possible to reduce costs more easily than using other types of substrate such as a GaN substrate or a sapphire substrate. Moreover, since a silicon substrate has higher heat dissipation ability than a sapphire substrate, which is electrically insulating, using a silicon substrate 100 as a substrate helps achieve better heat dissipation than using a sapphire substrate. This too helps increase the light output.

Figure 11:
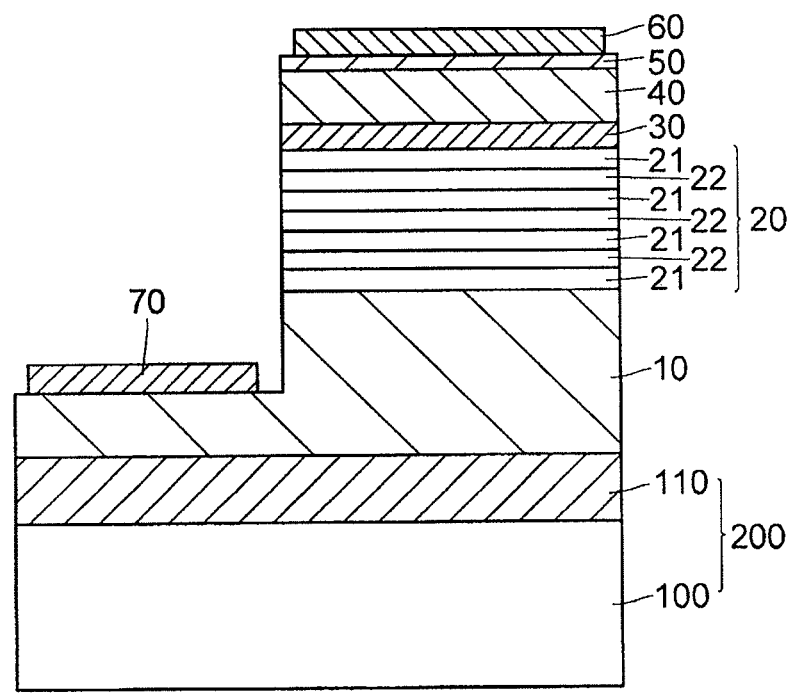
FIG. 11 is a sectional view of a light-emitting diode device according to a modified example of Embodiment 2.

FIG. 11 is a sectional view of a light-emitting diode device according to a modified example of Embodiment 2. Now, with reference to FIG. 11, the light-emitting diode device according to the modified example of Embodiment 2 will be described. In FIG. 11, such parts as correspond to any parts already described are identified by the same reference signs, and no overlapping description will be repeated unless necessary.

In the modified example of Embodiment 2, the structure differs from that of Embodiment 2 described above in that, as shown in FIG. 11, the light-emitting diode device has a horizontal structure. Specifically, part of the stacked structure of nitride semiconductors formed on top of the template substrate 200 is etched away by dry etching or the like, from the p-type contract layer 50 down to halfway the depth of the n-type AlGaN layer 10. Then, on the bottom surface (the n-type AlGaN layer 10) of the etched-out part, the n-side electrode 70 is formed. Thus, in the modified example of Embodiment 2, the p-side electrode 60 and the n-side electrode 70 are both formed on the top side of the template substrate 200 (AlN buffer layer 110).

Although adopting a vertical structure as in Embodiment 2 is preferable to adopting a horizontal structure, even in a case where a horizontal structure is adopted as in this example, it is possible to form high-Al-content nitride semiconductor layers crack-free. Thus, also with the modified example of Embodiment 2 adopting a horizontal structure, it is possible to obtain a crack-free far-ultraviolet light-emitting device at low costs.

Embodiment 3

Figure 12:
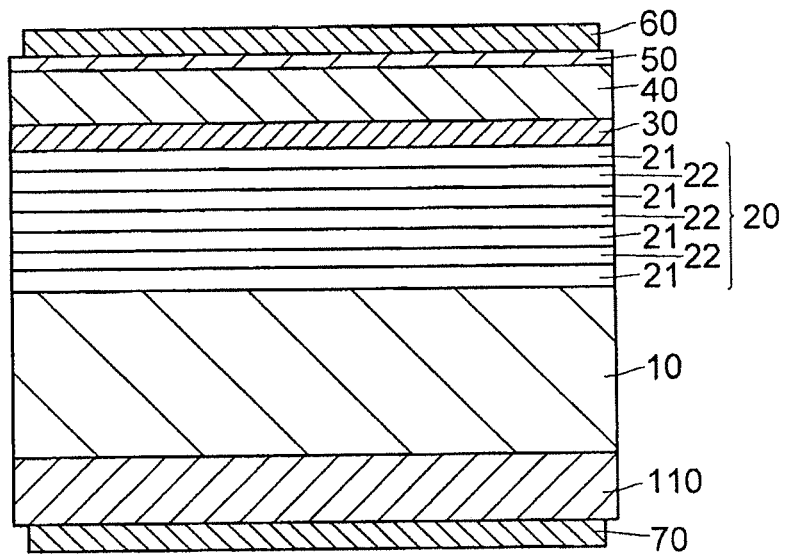
FIG. 12 is a sectional view of a light-emitting diode device according to Embodiment 3 of the invention.

FIG. 12 is a sectional view of a light-emitting diode device according to a third embodiment (Embodiment 3) of the invention. Now, with reference to FIG. 12, the light-emitting diode device (semiconductor device) according to Embodiment 3 of the invention will be described. In FIGS. 10 and 12, corresponding parts are identified by the same reference signs, and no overlapping description will be repeated unless necessary.

In the light-emitting diode device according to Embodiment 3, the structure differs from that of Embodiment 2 described previously in that the silicon substrate 100 (see FIG. 10) is removed by chemical processing using a chemical liquid or the like. Then, on the back surface of the AlN buffer layer exposed as a result of removal of the silicon substrate 100, the n-side electrode 70 is formed. The n-side electrode 70 is, for example, a Ni/Au electrode of a multiple layer structure having a Ni layer (not shown) and a Au layer (not shown) stacked in this order from the AlN buffer layer 110 side.

In other respects, the structure of Embodiment 3 is similar to that of Embodiment 2 described previously.

As described above, in Embodiment 3, removing the silicon substrate 100 makes it possible to easily obtain the device structure alone. Thus, by forming the n-side electrode 70 on the back surface of AlN buffer layer 110, it is possible to easily form a device of a vertical structure. This makes it possible to easily increase the light output on the basis of scaling up by increasing the device area.

The silicon substrate 100 can easily be exfoliated (removed) by chemical processing using a chemical liquid or the like. Thus, using a silicon substrate 100 as a substrate makes it possible to remove the substrate easily.

Moreover, owing to the depressed structures 105 being formed on the surface of the silicon substrate 100, for example, when etching using a chemical liquid is performed, the chemical liquid more easily permeates into the silicon substrate 100, making its removal easier.

In other respects, the effects of Embodiment 3 are similar to those of Embodiment 2 described previously.

Figure 13:
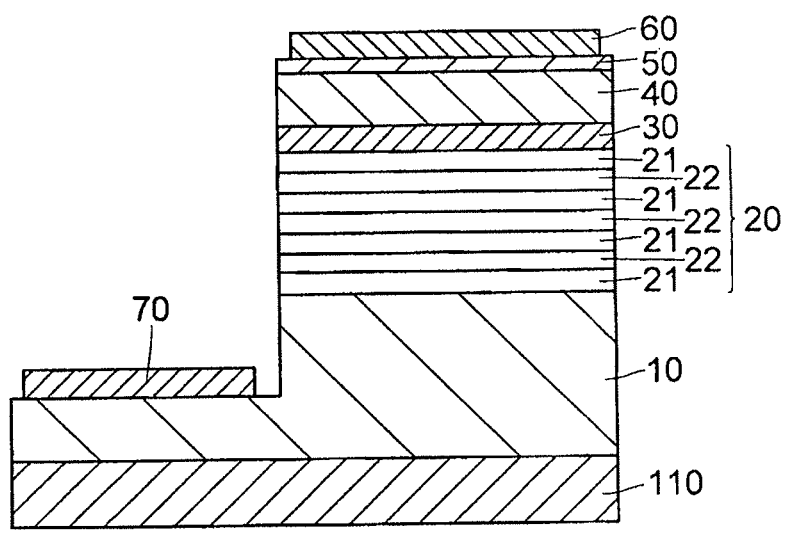
FIG. 13 is a sectional view of a light-emitting diode device according to a modified example of Embodiment 3.

FIG. 13 is a sectional view of a light-emitting diode device according to a modified example of Embodiment 3. Now, with reference to FIG. 13, the light-emitting diode device according to the modified example of Embodiment 3 will be described. In FIG. 13, such parts as correspond to any parts already described are identified by the same reference signs, and no overlapping description will be repeated unless necessary.

In the modified example of Embodiment 3, the structure differs from that of Embodiment 3 described above in that, as shown in FIG. 13, the light-emitting diode device has a horizontal structure. That is, in the modified example of Embodiment 3, the device structure differs from that of the modified example of Embodiment 2 in that the silicon substrate 100 is exfoliated (removed).

In other respects, the structure of the modified example of Embodiment 3 is similar to that of Embodiment 3 described above and that of the modified example of Embodiment 2 described previously.

Also with the modified example of Embodiment 3, it is possible to form high-Al-content nitride semiconductor layers crack-free. Thus, it is possible to obtain a crack-free far-ultraviolet light-emitting device at low costs.

Embodiment 4

Figure 14:
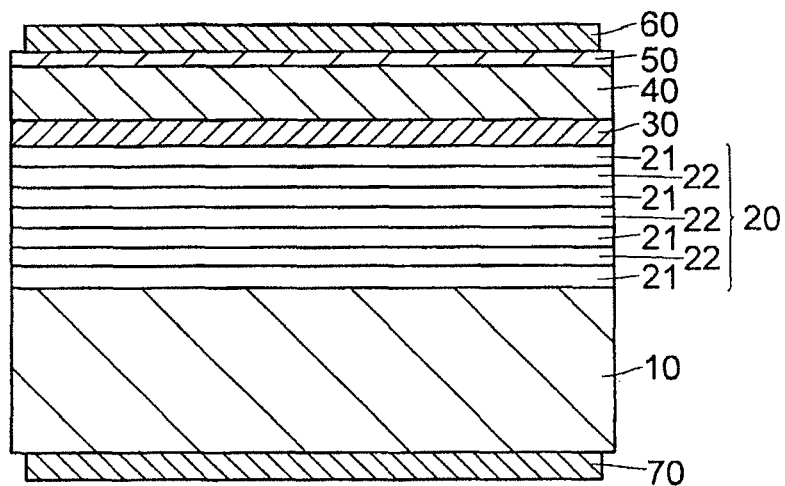
FIG. 14 is a sectional view of a light-emitting diode device according to Embodiment 4 of the invention.

FIG. 14 is a sectional view of a light-emitting diode device according to a fourth embodiment (Embodiment 4) of the invention. Now, with reference to FIGS. 12 and 14, the light-emitting diode device (semiconductor device) according to Embodiment 4 of the invention will be described. In FIG. 14, such parts as correspond to any parts already described are identified by the same reference signs, and no overlapping description will be repeated unless necessary.

In the light-emitting diode device according to Embodiment 4, the structure differs from that of Embodiment 3 described previously in that the AlN buffer layer 110 (see FIG. 12) is removed by dry etching such as RIE (reactive ion etching) or by chemical processing using a chemical liquid or the like. On the back surface of the AlGaN layer 10 exposed as a result of removal of the AlN buffer layer 110, the n-side electrode 70 is formed. The n-side electrode 70 is, for example, a Ni/Au electrode of a multiple layer structure having a Ni layer (not shown) and a Au layer (not shown) stacked in this order from the AlGaN layer 10 side.

While it goes without saying that the AlN buffer layer 110 can be removed by common dry etching, it can also be removed by dissolving it away with a solution. Generally, nitride semiconductors, owing to the extremely strong interatomic bond ascribable to the very small ion diameter of nitrogen, which is one of their constituent elements, are highly stable against chemicals, unlike other group III-V compound semiconductors such as GaAs, GaP, and InP and compounds of these. In contrast, the AlN buffer layer 110 according to the invention, since it has effects of reducing strain in the layers stacked on top and reducing cracks, contains dislocations at an extremely high density. The dislocations contained in the silicon substrate 100 are called edge dislocations, of which the density is as high as about $10^9$ cm$^{-2}$ or more. An extremely high concentration of contained dislocations like this spoils the inherent, extremely high chemical stability ascribable to nitrogen. According to experiments and studies the present inventors conducted, an extremely high dislocation density degrades chemical stability on particular glide planes that have occurred in a crystal as a result of the presence of dislocations, and the higher the dislocation density is, the higher the degree of degradation. The reason is considered to be that, on glide planes, not all the bonds of nitrogen, or Al or Ga, are bonded, that is, many dangling bonds remain, and these dangling bonds cause boosted chemical reactivity. In the examples of structures according to the invention, glide planes are exposed at facets of the device structure, and this further boosts the chemical reactivity with the outside of the crystal. For these reasons, by immersing the silicon substrate 100 in an exposed state in, for example, a solution of phosphoric acid and sulfuric acid mixed in a predetermined ratio, an aqueous solution of potassium hydroxide in a predetermined concentration, or molten potassium hydroxide, it is possible, via dislocations, to selectively dissolve the AlN buffer layer 110 alone completely away. In such cases, for example, in a case where a mixed solution of phosphoric acid and sulfuric acid is used, the silicon substrate 100 alone can be selectively removed in a temperature range of about 100° C. to about 260° C. without any problem. In a case where an aqueous solution of potassium hydroxide is used, the AlN buffer layer 110 can be selectively removed up to 100° C. which is the boiling point of water. Moreover, in a case where an aqueous solution of potassium hydroxide is used, the dissolution speed can be increased by irradiation with light from a xenon lamp or a mercury lamp. The reason is considered to be that, out of electron-hole pairs occurring in the AlN buffer layer that has absorbed light, holes react with ions in the potassium hydroxide solution.

In other respects, the structure of Embodiment 4 is similar to that of Embodiment 3 described previously.

As described above, in Embodiment 4, by removing the AlN buffer layer 110, it is possible to easily obtain the device structure alone. Thus, by forming the n-side electrode 70 on the back surface of the n-type AlGaN layer 10, it is possible to easily form a device having a vertical structure. This makes it possible to easily increase the output on the basis of scaling up by increasing the device area, and in addition obtain, as a result of the high-resistance AlN buffer layer 110 being removed, an effect of reducing the driving voltage of the device.

In other respects, the benefits of Embodiment 4 are similar to those of Embodiment 3 described previously.

Figure 15:
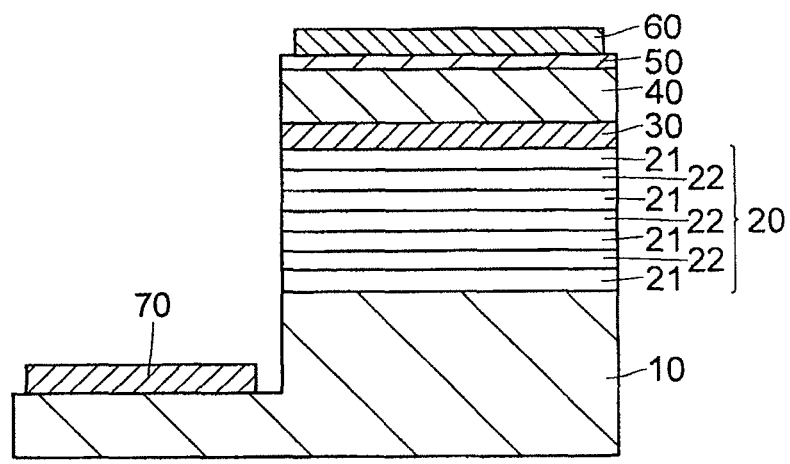
FIG. 15 is a sectional view of a light-emitting diode device according to a modified example of Embodiment 4.

FIG. 15 is a sectional view of a light-emitting diode device according to a modified example of Embodiment 4. Now, with reference to FIG. 15, the light-emitting diode device according to the modified example of Embodiment 4 will be described. In FIG. 15, such parts as correspond to any parts already described are identified by the same reference signs, and no overlapping description will be repeated unless necessary.

In the modified example of Embodiment 4, the structure differs from that of Embodiment 3 described previously in that, as shown in FIG. 15, the light-emitting diode device has a horizontal structure. That is, in the modified example of Embodiment 4, the device structure differs from that of the modified example of Embodiment 3 in that the AlN buffer layer 110 is exfoliated (removed).

In other respects, the structure of the modified example of Embodiment 4 is similar to those of the modified examples of Embodiments 3 and 2.

Also with the modified example of Embodiment 4, it is possible to form high-Al-content nitride semiconductor layers crack-free. Thus, it is possible to obtain a crack-free far-ultraviolet light-emitting device at low costs.

It should be understood that the embodiments presented above are in every way illustrative and not restrictive. The scope of the invention is defined not by the description of the embodiments given above but by the appended claims, and encompasses any variations and modifications made in the sense and scope equivalent to those of the claims.

For example, although Embodiments 1 to 4 described above deal with examples where an MOCVD method is used for crystal growth of nitride semiconductor layers on top of the substrate, this is not meant to limit the invention; any crystal growth method other than an MOCVD method may be used for crystal growth of nitride semiconductor layers on top of the substrate. For example, an MBE (molecular beam epitaxy) method, an HDVPE (hydride vapor phase epitaxy) method, or the like may be used for crystal growth of nitride semiconductor layers.

Although Embodiments 1 to 4 described above deal with examples where a silicon substrate that has a (111) plane as its principal plane is used, this is not meant to limit the invention; the principal plane of the silicon substrate may be any plane other than a (111) plane. It may be, for example, a {100} plane or a {110} plane.

Although Embodiment 1 deals with an example where a high-Al-content AlGaN layer is grown on top of the AlN buffer layer, this is not meant to limit the invention; a nitride semiconductor layer with a still higher Al content (for example, an AlN layer) may be grown on top of the AlN buffer layer. Even in a case where a nitride semiconductor layer with an extremely high Al content like that is grown, it is possible to suppress development of dislocations and cracks and a warp in the substrate. Needless to say, a nitride semiconductor layer with a comparatively low Al content may be grown on top of the AlN buffer layer. It is possible even to grow any nitride semiconductor layer other than an AlGaN or AlN layer, for example a GaN, InGaN, or like layer, on top of the AlN buffer layer.

Although Embodiment 1 deals with an example where an AlN buffer layer is grown on top of the silicon substrate, this is not meant to limit the invention; a buffer layer of any material other than AlN may be grown on top of the silicon substrate. As a buffer layer grown on top of a silicon substrate, an AlN like that described above is preferable.

Although Embodiment 1 deals with an example where a silicon substrate is used as the substrate, any substrate other than a silicon substrate may be used instead so long as it allows formation of depressed structures on the substrate surface through feeding of a source material. Specifically, for example, a substrate of SiC, ZnO, $Al_xGa_{1-x}N$ ($0 \leq x \leq 1$), $Ga_2O_3$, or the like may be used. In such cases, as the reactive gas with which the substrate is to be reacted, it is preferable to use hydrogen, oxygen, an organic metal compound (such as trymethylgallium, trimethylaluminum, triethylaluminum, or triethylgallium), $Cl_2$, methane, ethane, or the like. In a case where a silicon substrate is used as the substrate, it is further preferable to use TMA as in Embodiment 1.

Although Embodiments 2 to 4 deal with examples where the present invention is applied to a light-emitting diode device as an example of a semiconductor device, this is not meant to limit the invention; the invention may be applied to any semiconductor light-emitting devices other than light-emitting diode devices (for example, semiconductor laser devices). The invention may be applied to devices using nitride semiconductors, such as electronic devices, in general (for example, power transistors, ICs (integrated circuits), LSIs (large-scale integrated circuits), etc.). One specific example of such electronic devices is the HEMT (high-electron-mobility transistor).

Although Embodiments 2 to 4 deal with examples where the well layers in the light-emitting layer are AlGaN layers, this is not meant to limit the invention; the well layers may be AlInGaN layers which further contain In.

Although Embodiments 2 to 4 deal with, as an example of a light-emitting diode device, a light-emitting diode device that emit light in a far-ultraviolet region, this is not meant to limit the invention; the invention may be applied to a light-emitting diode device that emits light in a region other than a far-ultraviolet region.

In Embodiments 2 to 4, the thickness, composition, etc. of the individual nitride semiconductor layers formed on top of the substrate by crystal growth may be appropriately combined or modified to yield the desired characteristics. For example, it is possible to add or omit one or more semiconductor layers, or change the order of some semiconductor layers. It is also possible to change the conductivity type of some semiconductor layers. In short, any modifications are possible so long as the basic characteristics of a semiconductor device are obtained.

What is claimed is:

1. A semiconductor device comprising:
a silicon substrate;
an AlN layer grown on top of the silicon substrate; and
a nitride semiconductor layer formed on top of the AlN layer,
wherein a void is included inside the AlN layer,
the silicon substrate has a depressed structure on a top surface thereof, and the void in the AlN layer is located over the depressed structure.

2. The semiconductor device according to claim 1, wherein the void in the AlN layer is wedge-shaped.

3. The semiconductor device according to claim 1, wherein the nitride semiconductor layer includes a light-emitting layer having a quantum well structure.

4. The semiconductor device according to claim 3, wherein the light-emitting layer includes a well layer formed of AlGaN.

5. The semiconductor device according to claim 1, wherein a first electrode layer is formed on a top side of the AlN layer, and
a second electrode layer is formed on a bottom side of the AlN layer.

6. The semiconductor device according to claim 1, wherein a first electrode layer is formed on a top surface of a device structure after removal of the AlN layer, and
a second electrode layer is formed on a bottom surface of the device structure.

* * * * *